United States Patent [19]

Otsuki et al.

[11] Patent Number: 5,527,648
[45] Date of Patent: Jun. 18, 1996

[54] METHOD FOR PRODUCING COLOR FILTER

[75] Inventors: Yutaka Otsuki; Hitoshi Yuasa; Hiroyoshi Omika, all of Yokohama; Masayuki Ando, Kashiwa, all of Japan

[73] Assignees: Nippon Oil Co., Ltd.; Dai Nippon Printing Co., Ltd., both of Tokyo, Japan

[21] Appl. No.: 352,572

[22] Filed: Dec. 9, 1994

[30] Foreign Application Priority Data

Dec. 28, 1993 [JP] Japan ................... 5-337301

[51] Int. Cl.$^6$ ................................ G03F 9/00
[52] U.S. Cl. .................. 430/7; 430/20; 430/321
[58] Field of Search ................... 430/7, 321, 20

[56] References Cited

U.S. PATENT DOCUMENTS

| | | | |
|---|---|---|---|
| 5,214,541 | 5/1993 | Yamasita et al. | 359/891 |
| 5,214,542 | 5/1993 | Yamasita et al. | 359/891 |
| 5,314,770 | 5/1994 | Yamasita et al. | 430/7 |
| 5,334,468 | 8/1994 | Yamasita et al. | 430/7 |
| 5,368,977 | 11/1994 | Yoda et al. | 430/190 |
| 5,372,902 | 12/1994 | Yamashita et al. | 430/7 |
| 5,385,795 | 1/1995 | Yuasa et al. | 430/7 |
| 5,399,449 | 3/1995 | Tanimoto et al. | 430/7 |
| 5,411,836 | 5/1995 | Yoda et al. | 430/190 |
| 5,422,207 | 6/1995 | Yoda | 430/7 |
| 5,427,888 | 6/1995 | Yoda et al. | 430/192 |

FOREIGN PATENT DOCUMENTS 61-272720  12/1986  Japan.
63-210901   9/1988  Japan.
4-324801   11/1992  Japan.

*Primary Examiner*—Charles L. Bowers, Jr.
*Assistant Examiner*—John A. McPherson
*Attorney, Agent, or Firm*—Darby & Darby

[57] ABSTRACT

A method for producing a color filter involves (a) forming a positive photosensitive coating film on a transparent electrically conductive layer of a transparent substrate; (b) forming on the photosensitive coating film a first region where a light irradiation amount is different in two steps; (c) developing a light-irradiated portion of the first region to lay-open the transparent conductive layer followed by electrodepositing a colored coating thereon to form a colored layer; (d) forming on the remaining photosensitive coating film a second region where a light irradiation amount is different in two steps; (e) developing a light-irradiated portion of the second region to lay-open the transparent conductive layer followed by electrodepositing a colored coating thereon to form a colored layer; (f) removing the remaining photosensitive coating film not developed in the steps (c) and (e); (g) forming a positive or negative photosensitive coating film on the transparent substrate; (h) forming on the photosensitive coating film formed in the step (g) a third region where a light irradiation amount is different in at least three steps; and (i) developing the third region to lay-open the transparent conductive layer followed by electrodepositing a colored coating thereon to form a colored layer, the operation of the developing and electrodepositing being sequentially repeated in the order of decreasing or increasing light irradiation amounts to thereby form different colored layers.

10 Claims, 4 Drawing Sheets

FIG.1

☐ Portion of 100% Light Transmittance
▨ Portion of 0% Light Transmittance

FIG.2

☐ Portion of 100% Light Transmittance
▨ Portion of 0% Light Transmittance

FIG.3

☐ Portion of 100% Light Transmittance
◧ Portion of 70% Light Transmittance
◨ Portion of 0% Light Transmittance

FIG.4

☐ Portion of 100% Light Transmittance
◨ Portion of 0% Light Transmittance

FIG.5

☐ Portion of 100% Light Transmittance
▨ Portion of 0% Light Transmittance

FIG.6

☐ Portion of 100% Light Transmittance
▨ Portion of 0% Light Transmittance

FIG.7

☐ Portion of 100% Light Transmittance
◨ Portion of 70% Light Transmittance
◪ Portion of 0% Light Transmittance 3,527,648

METHOD FOR PRODUCING COLOR FILTER

BACKGROUND OF THE INVENTION

This invention relates to a method for producing a color filter and more particularly to a method for producing a color filter convenient to be employed as a color liquid crystal display device.

Up to now, color filters in general have been produced by a dyeing method, a printing method or a pigment dispersion method, in which a transparent substrate is colored using a binder containing a dye or a pigment.

However, since the dyeing method is a method for selectively dyeing a thin resin film on a substrate with a dyestuff, it is necessary to carry out the resist printing process and the photolithographic process each time the color is changed, such that the process becomes complex with consequent rise in production costs. On the other hand, since the dyestuff is employed as a coloring agent, the product is poor in thermal resistance, weatherability or resistance against chemicals. Although there is no necessity of carrying out the resist printing process with the above printing method, there is a limitation imposed on refinement of color patterns, such that the more variegated in the color pattern, the precision of printing position becomes the worse. Although it is possible to generate fine patterns with the pigment dispersion method, the photolithographic process of high precision needs to be carried out each time the color is changed, thus complicating the process.

On the other hand, there has been proposed a method for producing a color filter by an electrodeposition coating method. For example, with the electrodeposition method for preparation of the color filter, since a transparent filter is previously formed with a pre-set pattern and placed in a vat containing an ionized high molecular material containing a dye or a pigment dissolved or dispersed in a solvent for producing the color filter under application of an electrical voltage, a transparent electrode for the formation of the color filter is required in addition to the transparent display electrode. Since the transparent electrode needs to be insulated from one color to another, an etching process is required, while there is a risk of the decreased yield due to line defects produced by electrical shorting. Besides, since respective pixels need to be electrically coupled to one another, there is imposed a limitation on pixel arraying.

In the Japanese Laid-open Patent Applications Nos. 61-203403 (1986), 61-272720 (1986) and 61-279803 (1986), there is disclosed a method comprising coating a positive photosensitive composition on a glass substrate carrying a transparent electrode thereon, exposing and developing a preset color filter-forming portion, exposing an electrode surface, forming a color filter on the exposed transparent electrode surface by an electrodeposition method, exposing the entire assembly for removing the positive photosensitive composition and etching off the exposed transparent electrically conductive layer.

In the Japanese Laid-open Patent Application No. 63-249107, there is disclosed a method for forming a color filter by a high molecular electrodeposition method comprising forming a resist pattern having a window by photo-etching.

In the Japanese Laid-open Patent Application No. 61-272720, there is disclosed a method comprising the steps of forming an electrically conductive layer on a substrate, forming a positive photosensitive coating film thereon, exposing the coating film and developing and removing the exposed portion with the above steps being repeated a number of times equal to the number of colors. Since the positive photosensitive coating film is employed, and only the exposed portion is solubilized in the developing solution, exposure and development operations can be repeated without exfoliating the photosensitive coating film. Although the positive photosensitive coating film need not be exfoliated and can be re-used with this method, it is necessary to carry out the steps of light exposure, development and coloring a number of times equal to the number of colors. With the currently used color filter, not only red, green and blue colors, but also a black matrix and a transparent outer frame are required, so that the number of repetition of the above steps is correspondingly increased. Especially, with the above method, the number of steps of electrodeposition followed by exposure equal to the number of colors less one is required. However, since the light exposure device is complicated, the step of electrodeposition followed by light exposure needs to be carried out with meticulous attention and painstaking operations of washing and drying after the electrodeposition, thereby complicating the process. In addition, the step of introducing and removing the substrate into and out of the light exposure device poses a significant work load. The color filter needs to be formed without exfoliating the photosensitive film even once, while the steps of electrodeposition and heating for drying need to be carried out a large number of times thereby affecting photosensitivity and solubility of the photosensitive coating film. The result is that portions which should be removed at the time of resist removal cannot be removed completely and are left over, thus producing significant production problems. In addition, if the production line is taken into consideration, it is necessary to provide a number of expensive light exposure devices equal to the number of times of the exposure operations for repetition of the steps comprising electrodeposition and subsequent exposure. Thus, there is raised a demand for reducing the number of times of introducing and removing the substrate and especially for minimizing the number of processes of introducing the substrate into the exposure device after the coloring step.

SUMMARY OF THE INVENTION

In view of the foregoing, it is an object of the present invention to resolve the above problems and to provide a method for a color filter which assures a larger degree of freedom of the shape of the light shielding layer and the colored layer without requiring further refinement of processing technology and which lends itself to a larger format and to facilitated and simplified mass production of the color filter.

It is another object of the present invention to provide a method for producing by a simplified process a color filter having at least red, green and blue colored layers and a dark-colored light shielding layer and occasionally having a transparent outer frame portion, which is suitable for use as a liquid crystal color display color filter.

The above and other objects of the invention will become more apparent from the following description.

The present inventors have conducted investigations into the method for producing a color filter which can assure a larger degree of shape freedom of the light shielding layer and the colored layers and which can lend itself to a larger filter format, and found that a color filter having an excellent performance can be produced by a simplified process of combining the positive or negative photoresist and a particular light exposure method.

According to the present invention, there is provided a method for producing a color filter comprising the steps of:

(a) forming a positive photosensitive coating film on a transparent electrically conductive layer of a transparent substrate having the transparent electrically conductive layer thereon;

(b) forming on the positive photosensitive coating film a first region where a light irradiation amount is different in two steps;

(c) developing at least a light-irradiated portion of the first region of the positive photosensitive coating film to lay-open the transparent electrically conductive layer followed by electrodepositing a colored coating thereon to form a colored layer;

(d) forming on the remaining positive photosensitive coating film a second region where a light irradiation amount is different in two steps;

(e) developing at least a light-irradiated portion of the second region of the positive photosensitive coating film to lay-open the transparent electrically conductive layer followed by electrodepositing a colored coating thereon to form a colored layer;

(f) removing the remaining positive photosensitive coating film not developed in the steps (c) and (e);

(g) forming a photosensitive coating film on the transparent substrate from which the positive photosensitive coating film is removed in the step (f), the photosensitive coating film being selected from the group consisting of a positive photosensitive coating film and a negative photosensitive coating film;

(h) forming on the photosensitive coating film formed in the step (g) a third region where a light irradiation amount is different in at least three steps; and (i) developing the photosensitive coating film of the third region to lay-open the transparent electrically conductive layer followed by electrodepositing a colored coating thereon to form a colored layer, the operation of the developing and electrodepositing being sequentially repeated in the order of decreasing light irradiation amounts when the photosensitive coating film is a positive photosensitive coating film and in the order of increasing light irradiation amounts when the photosensitive coating film is a negative photosensitive coating film, to thereby form different colored layers.

PREFERRED EMBODIMENTS OF THE INVENTION

The present invention will be explained in detail hereinbelow.

With the method according to the present invention, a positive photosensitive coating film is first formed on a transparent electrically conductive layer of a transparent substrate having the transparent electrically conductive layer thereon (referred to herein as a step (a)).

There is no particular limitation to the transparent substrate employed in the present invention, provided that it is a plate-shaped transparent substrate having the transparent electrically conductive layer formed thereon. The substrate material may be enumerated by glass, various laminated plates, various plastic plates and other plate-shaped insulators, on the surfaces of which the transparent electrically conductive layers and light shielding layers are formed. In view of the performance of the color filter, the substrate surface is preferably smooth and, if need be, may be polished. The material of the transparent electrically conductive layer formed on the substrate includes a material composed of tin oxide, indium oxide or antimony oxide. The film thickness of the transparent electrically conductive layer is preferably 20 to 300 nm. There is no limitation to the method for forming the transparent electrically conductive layer and any of known methods such as spraying method, chemical vapor deposition, sputtering or vacuum deposition may be employed. In view of the performance of the color filter, the transparent electrically conductive layer as transparent as possible is preferably employed.

Although there is no limitation to the method for forming the positive photosensitive coating film formed on the transparent electrically conductive layer of the transparent substrate, the positive photosensitive coating film may be applied to the transparent electrically conductive layer by any known methods, such as electrodeposition, spraying, dip coating, roll coating, screen printing or spin coating.

The positive photosensitive coating for forming the positive photosensitive coating film may be enumerated by a coating containing a resin having film forming capability and photosensitivity, referred to herein as a positive photosensitive coating resin, and optionally a dye and/or a pigment dispersed or dissolved in an organic solvent or water. If the electrodeposition coating is selected as the positive photosensitive coating, the step (a) may be carried out by an electrodeposition method. The positive photosensitive coating may or may not contain the dye and/or the pigment.

There is no limitation to the positive photosensitive coating resin preferably employed in the present invention, provided that the light-irradiated portion may be removed with the developing solution. Examples of the positive photosensitive coating resin include a resin having a quinone diazide group, a resin having diazomeldrum's acid or nitrobenzyl ester and a resin composition containing these resins. Specifically, the positive photosensitive coating resin may be enumerated by a quinone diazide group-containing cationic resin composition that may be solubilized in acids or acidic substances, such as formic acid, acetic acid, propionic acid or lactic acid, a quinone diazide group-containing anionic resin composition that may be solubilized and/or dispersed in water with a basic substance, such as triethylamine, diethylamine, dimethyl ethanolamine or ammonia, and a composition produced by suitably mixing a film-forming resin with a resin obtained by reacting a compound containing hydroxyl groups and a quinone diazide sulfonic acid derivative. For simplifying the process and combatting the pollution, it is desirable to use a resin capable of being solubilized and/or dispersed in water. The quinone diazide group-containing cationic resin composition is a resin produced by introducing an amino group and/or ammonium capable of being converted into onium groups, an onium group such as sulfonium and hydroxyl groups into, e.g. acrylic resin, epoxy resin, urethane resin or polybutadiene resin and adding a quinone diazide sulfonic acid compound by an esterification reaction, while the quinone diazide group-containing anionic resin composition is a resin produced by introducing carboxylic groups and hydroxyl groups into acrylic resin, polyester resin, maleinated oil resin, polybutadiene resin and epoxy resin and adding a quinone diazide sulfonic acid compound by an esterification reaction. The mixing ratio in the above composition may be optionally selected depending on the light irradiating condition or developing conditions. In addition, a positive photoresist containing compounds containing groups capable of generating an alkali or water-soluble groups by an acid catalyst and a photo-acid generator as essential components may also be employed. The commercially available positive photoresists of various types may also be employed.

The organic solvents employed for dispersing or dissolving the various components of the positive photosensitive coating may be those capable of dispersing or dissolving the above resins. Examples of these organic solvents include various glycol ethers, such as ethylene glycol monobutyl ether, ethylene glycol monohexyl ether, ethylene glycol monophenyl ether, propylene glycol monomethyl ether, propylene glycol monophenyl ether, diethylene glycol dimethyl ether or triethylene glycol dimethyl ether; ketones, such as acetone, methylethylketone, methylisobutylketone, cyclohexanone, isophorone, or N-methyl pyrrolidone; ethers such as dibutyl ether, dioxane or tetrahydrofuran; alcohols, such as methoxy butanol, diacetone alcohol, butanol, octanol or isopropanol; hydrocarbons, such as toluene, xylene, cyclohexane or hexane; esters, such as ethyl acetate, butyl acetate, 2-methoxyethyl acetate, 2-ethoxyethyl acetate, 2-methoxypropyl acetate, or ethyl benzoate, and acid amides, such as dimethyl formamide, N,N-dimethyl acetamide or dimethyl sulfoxide. These may be used singly or in combination.

For facilitating solubilization or dispersion, and improving bath stability as well as for producing a smooth coating film, the organic solvents may be added at the time of solubilizing and/or dispersing the cationic or anionic resin in water.

If needed, the positive photosensitive coating may be admixed with dyes and/or pigments. The color hues of the dyes and/or the pigments may be suitably selected according to usage and application. For improving resolution of the positive photosensitive coating, for example, it is desirable to admix a dye capable of absorbing the light having a wavelength of 400 to 500 nm, such as oil yellow, or UV absorbing agents, such as trihydroxy benzophenone, with a view to eliminating the light of a longer wavelength exhibiting acute diffraction on light irradiation. Depending on the desired color hues, two or more of different types of the dyes and/or the pigments may be used in mixture insofar as the properties of the dyes and/or the pigments are not impaired. The proportions of the dyes and/or pigments are suitably selected depending on the usage or application, color hues, types of the dyes and/or pigments employed or the dry thickness of the positive photosensitive coating, and are preferably on the order of 0.01 to 10 wt % and, above all, 0.1 to 5.0 wt % based on the overall positive photosensitive coating.

The positive photosensitive coating may be prepared by mixing the positive photosensitive coating resin, organic solvents and/or water, dyes and/or pigments, if necessary, acidic or basic substances, dispersion assistant agents for the dyes and/or the pigments, or a variety of assistant agents, such as levelling agents for improving smoothness of the coating films, viscosity adjustment agents or anti-foaming agents, sufficiently dispersing the resulting mixture using dispersion devices, such as sand mills, roll mills or attriters and diluting the resulting product to a desired concentration. There is no particular limitation to the film thickness of the positive photosensitive coating film formed by the positive photosensitive coating thus prepared, such that the film thickness can be suitably selected depending on the performance required of the color filter. Thus, the dry film thickness of the positive photosensitive coating film is usually 0.3 to 20 μm, preferably 0.5 to 15 μm, most preferably 1 to 3 μm. If the film is formed by electrodeposition, the film thickness can be controlled by adjusting electrodeposition conditions, such as current, voltage, electrodeposition time or liquid temperature. However, the electrodeposition may usually be carried out under conditions similar to those used for electrodeposition of the colored coating, as will be explained subsequently.

In the method of the present invention, a first region where a light irradiation amount is different in two steps is formed on the positive photosensitive coating film (referred to herein as a step (b)). The first region where the light irradiation amount is different in two steps or stages in the step (b) may be a light irradiated portion and a non-light irradiated portion.

There is no particular limitation to the shape of the first region which may be suitably selected depending on the usage and application of the color filter. In this manner, not only the portion intended for the colored layer and the portion intended for the light shielding layer may preferably be formed. If it is desired to form a color filter having a light shielding layer, it is preferred for the light-irradiated portion in the first region in the step (b) having a larger light volume to be a portion intended for the light shielding layer because then the light shielding layer in need of utmost precision can be formed first, thus rendering it possible to improve the precision of the color filter in its entirety. The light-irradiated portion may preferably include a registration mark for assembling the liquid crystal color display and the shape of a transparent outer frame for the color filter since the registration mark and the outer frame can be produced simultaneously at the time of fabrication of the color filter for simplifying the production process and improving the production precision.

There is no particular limitation to the method of the step for forming the first region having the light irradiation amount different in two steps. For example, it is preferred to irradiate the substrate once using a mask having different light transmittances in two steps. It is in general more preferred to increase the relative difference in respective light transmittances since the light irradiation amount and the light irradiation time then can be adjusted more easily. However, if the difference in light transmittance is small, the same objective may be achieved by increasing the light irradiation amount or protracting the light irradiation time. Consequently, although no limitations are imposed on the relative difference in light transmittances, the significant relative difference of not less than 5% is usually preferred.

For light irradiation, a unit capable of generating a large quantity of UV rays, such as a high-pressure mercury lamp, an ultra-high pressure mercury lamp or a metal halide lamp, may be employed as a light source. If needed, a radiation source other than the source of UV rays may also be used. The light irradiation conditions may be suitably selected depending on the positive photosensitive coating, light exposure units or the masks employed. In this manner, the first region having light transmittances different in two steps or stages can be formed on the positive photosensitive coating.

With the method of the present invention, at least a light-irradiated portion of the first region of the positive photosensitive coating film is developed to lay-open the transparent electrically conductive layer and a colored coating is electrodeposited thereon to form a colored layer (referred to herein as a step (c)). The conditions for developing the positive photosensitive coating film may be changed depending on the light irradiation amount for the portion that should be removed, solubility of the positive photosensitive coating in the developing solution, the type or the concentration of the developing solution, developing temperature or the developing time. Thus, it suffices to select the condition which will be suited to the resins employed for the preparation of the photosensitive coating.

The developing solution which may be employed for the step (c) may usually be an aqueous solution of a basic substance enumerated by sodium carbonate, sodium hydrogen carbonate, sodium metasilicate, tetraalkyl ammonium hydroxide, sodium hydroxide and potassium hydroxide. If an aqueous solution of sodium metasilicate, for example, is employed for a developing solution, the sodium metasilicate concentration, temperature and the developing time may suitably be selected usually from the ranges of 0.01 to 25 wt %, 10° to 70° C. and 2 to 600 seconds, respectively, and preferably from the ranges of 0.05 to 20 wt %, 15° to 50° C. and 30 to 300 seconds, respectively. The developing solution employed at the step (c) may be admixed with surfactants, organic solvents, such as alcohols, glycol ethers, ketones or chlorinated hydrocarbons, or defoaming agents.

After development, the colored coating is electrodeposited on the exposed transparent electrically conductive layer to form a colored layer.

As the colored coating, cationic or anionic resins may be employed as the resin components and dyes and/or pigments may be admixed as colored components. In addition, the coating may be employed which contains acidic or basic substances dissolved and/or dispersed in water. Organic solvents may also be added for facilitating the dissolution and/or dispersion of the resin in the colored coating for improving bath stability and smoothness of the coating film.

The cationic resins employed as resin components of the colored coating may be acrylic resin, epoxy resin, urethane resin, polybutadiene resin or polyamide resin, into which amino group and/or ammonium that can be easily converted into onium groups and onium groups, such as sulfonium, are introduced, and which are solubilized or dispersed in acids or acidic substances, such as formic acid, acetic acid, propionic acid or lactic acid.

The anionic resins employed as resin components of the colored coating may be acrylic resin, polyester resin, maleinated oil resin, polybutadiene resin or epoxy resin, into which carboxylic groups are introduced and which may be solubilized or dispersed in water by basic substances, such as triethylamine, diethylamine, dimethyl ethanol amine or ammonia. The film-forming component of the colored coating may exhibit photosensitivity, while a mixture of melamine resin with an electrodeposition resin exhibiting strong thermosetting properties, such as acrylic rein or polyester resin, may be employed. Although it is more desirable to employ colored coatings different in kinds, color hues, color concentration or in color contrast for respective portions different in light irradiation amount, the same color hue may be used in redundancy if the number of portions different in light exposure is larger than the number of desired colors.

The color hues of the colored coating may be suitably selected depending on the usage and application. Although at least one color hue is selected at the step (c), for example, there is no particular limitation to the color hue. At the step (c), one of the colored layers may be black or dark color hue to provide a light shielding layer. For improving precision of the color filter, the colored layer by the first coloring step is preferably used as a light shielding layer.

The dyes and/or the pigments employed for the colored coating are selected depending on the targeted color hue. It is, however, desirable to select dyes and/or pigments which are free of defects in transparency and durability of the resulting coating film, stability of the coating or in electrodeposition characteristics. In such respect, oil-soluble or dispersible dyes are preferred, such as azo dyes, anthraquinone dyes, benzodifuranone dyes and condensed methine dyes. The pigments may be enumerated by organic pigments, such as azo lake, quinacridone, phthalocyanine, isoindolinone, anthraquinone or thioindigo and by inorganic pigments, such as chrome yellow, iron oxide, chrome vermilion, chrome green, ultramarine, prussian blue, cobalt blue, cobalt green, emerald green, titanium white or carbon black. As for the dyes and/or pigments, reference is had to "COLOR INDEX" whenever the necessity arises.

In the preparation of the colored coating, the resin, dyes and/or pigments, acidic or basic substances and, if needed, a variety of additives, such as organic solvents, dispersion assistant agents for the dyes and/or pigments, levelling agents for improving smoothness of the coating film, viscosity adjustment agents and anti-foaming agents, are mixed together and fully dispersed using well-known dispersion devices, such as sand mills, roll mills or attriters. The resulting dispersion is then diluted in water to a pre-set concentration, such as on the order of 4 to 25 Wt % and preferably 7 to 20 wt %, to give a coating suited for electrodeposition. The resulting colored coating is electrodeposited on the transparent electrically conductive layer to form a colored layer. There is no particular limitation to the film thickness of the colored layer which may be suitably selected depending on the performance desired of the color filter. The dry film thickness of the colored layer is usually 0.3 to 5 μm and preferably 1 to 3 μm.

Among the electrodeposition coating conditions, which may be suitably selected depending on the film thickness of the desired colored layer, the electrical voltage is usually the dc voltage of 5 to 500 V and preferably 10 to 300 V, while the electrodeposition time is usually 5 to 300 seconds and preferably 10 to 200 seconds and the liquid temperature is usually 10° to 35° C. and preferably 15° to 30° C. The supply of the electrical current is terminated when the electrodeposition time necessary to produce a desired film thickness has elapsed. The substrate is then taken out of the bath and, after any excess bath solution is washed off with water, the substrate is dried to form the colored layer.

Although the drying conditions may be suitably selected depending on the conditions of the subsequent steps, it is crucial that sufficient durability to prevent the electrodeposited colored layer from being damaged during at least the subsequent process be afforded to the electrodeposited layer and that such drying be carried out under such conditions as not to impair the characteristics of the positive photosensitive coating film. Thus, it is desirable to carry out the drying at a temperature not higher than 150° C. and preferably at 60° to 120° C. and during the drying time usually for 0.01 to 1 hour and preferably for 1 to 30 minutes.

With the method of the present invention, a second region where light irradiation amount is different in two steps or stages is formed on the remaining positive photosensitive coating film (referred to herein as a step (d)). The step (d) may be carried out by light exposure in a similar manner to the above step (b). The portion of the substrate devoid of the positive photosensitive coating film, for example having a colored layer inclusive of the light shielding layer formed thereon is devoid of photosensitivity, and hence may or may not be irradiated with light.

If, after forming the light shielding layer, a portion of the region neighboring to the light shielding layer is irradiated with light for forming the colored layer thereon, there is no particular necessity of precisely limiting the range of light exposure to the targeted colored layer portion, but the light may also be irradiated on the light shielding layer. That is, light exposure at the step (d) need not be performed using a high precision mask or light irradiating device. In addition, the boundary region of the light shielding layer and the colored layer can be positively irradiated with light.

With the method of the present invention, at least a light-irradiated portion of the second region of the positive photosensitive coating film is developed to lay-open the transparent electrically conductive layer, and a colored coating is subsequently electrodeposited thereon to form a colored layer (referred to herein as a step (e)). The step (e) may be carried out in the same way as in the step (c).

With the method of the present invention, the remaining positive photosensitive coating film not developed in the steps (c)and (e) are removed (referred to herein as a step (f)). The remaining portion of the positive photosensitive coating film may be removed by a method of employing a developing solution having higher dissolution capability or a method of irradiating at least a portion to be removed with a light volume larger than a pre-set volume and removing the portion with a developing solution. Such residual portion of the positive photosensitive coating film is removed since the initially formed positive photosensitive coating film is deteriorated by the development during the above steps (c) and (e), such that if such coating film is supplied to the subsequent step, pattern accuracies are deteriorated.

With the method of the present invention, a photosensitive coating film selected from a positive photosensitive coating film and a negative photosensitive coating film is formed on the transparent substrate from which the positive photosensitive coating film is removed (referred to herein as a step (g)). If the positive photosensitive coating film is formed, the step (g) may be executed by an operation similar to that of the step (a) using the positive photosensitive coating film. Thus, the following description is directed to using the negative photosensitive coating film.

The negative photosensitive coating for forming the negative photosensitive coating film which may be employed for the above step (g) may be enumerated by a coating containing a resin having film forming capability and photosensitivity, referred to herein as a negative photosensitive coating resin, and a light polymerization initiator and, if needed, dyes and/or pigments, dispersed or dissolved in water or organic solvents. Although the negative photosensitive coating may or may not contain the dyes and/or the pigments, it is possible for the dyes and/or the pigments of the color hues constituting a component of an ultimate color filter to be contained in the negative photosensitive coating film insofar as these are not detrimental to photocurability of the negative photosensitive coating. The negative photosensitive coating resin preferably employed in the present invention may be enumerated by a prepolymer or resin of a molecular weight of 500 to 10,000, having photosensitive groups, such as (meth)acryloyl groups, such as acryloyl groups or methacryloyl groups, or cinnamoyl groups, at a terminal or side chain of the molecule.

Such prepolymer or resin may be enumerated by prepolymers, such as epoxy (meth)acrylate, urethane (meth)acrylate or polyester (meth)acrylate, a cationic resin produced by introducing an amino group and/or ammonium capable of being converted into onium groups, or an onium group such as sulfonium and photosensitive groups into, e.g. acrylic resin, epoxy resin, urethane resin or polybutadiene resin, and an anionic resin,such as acrylic resin, polyester resin, maleinated oil resin, polybutadiene resin or epoxy resin into which carboxyl groups and the photosensitive groups are introduced. The above cationic resin may be solubilized and/or dispersed in water with acids or acidic substances, such as formic acid, acetic acid, propionic acid or lactic acid, while the anionic resin may be solubilized and/or dispersed in water with basic substances, such as triethylamine, diethylamine, dimethyl ethanol amine or ammonia. For simplifying the process and combatting the pollution, it is desirable to use a resin capable of being solubilized and/or dispersed in water.

To the above-mentioned negative photosensitive coating resin may be added low molecular (meth)acrylates for adjusting photosensitivity or viscosity of the coating film. Examples of the (meth)acrylates include 2-hydroxyethyl (meth)acrylate, 2-phenoxyethyl (meth)acrylate, 3-phenoxy-2-hydroxypropyl (meth)acrylate, 2-ethylhexyl (meth)acrylate, tricyclodecane (meth)acrylate, hexanediol di(meth)acrylate, trimethylolpropane triacrylate, pentaerythritol triacrylate, dipentaerythritol hexacrylate, and tris(acryloyl oxyethyl) isocyanurate. These may be used as a mixture. The proportion of these (meth)acrylates is 0 to 50 parts by weight and preferably 0 to 30 parts by weight based on 100 parts by weight of the negative photosensitive coating resin. The proportion of the(meth)acrylates in excess of 50 parts by weight may not be desirable since it leads to increased viscosity of the coating.

The photopolymerization initiators may be any of those known in the art, such as benzoin and ethers thereof, benzyl alkyl ketals, benzophenone derivatives, anthraquinone derivatives or thioxanthone derivatives, optionally admixed with any suitable sensitizes. The photopolymerization initiators may be added in a range of desirably 0.1 to 30 parts by weight and more desirably 0.5 to 20 parts by weight based on 100 parts by weight of the negative photosensitive coating resin. If the photopolymerization initiator is added in an amount less than 0.1 part by weight, photocurability may fall short, whereas if it is added in a amount exceeding 30 parts by weight, curing may proceed excessively so that the coating strength may fall short and economic demerits are induced. It is also possible to use commercially available negative photosensitive coatings (photoresists). As the organic solvents employed for dispersing or dissolving respective components of the negative photosensitive coating, those capable of dispersing or dissolving the resin or prepolymer may be employed. Examples of these organic solvents include various glycol ethers, such as ethylene glycol monobutyl ether, ethylene glycol monohexyl ether, ethylene glycol monophenyl ether, propylene glycol monomethyl ether, propylene glycol monophenyl ether, diethylene glycol dimethyl ether or triethylene glycol dimethyl ether; ketones, such as acetone, methylethylketone, methylisobutylketone, cyclohexanone, or isophorone; ethers such as dibutyl ether, dioxane or tetrahydrofuran; alcohols, such as methoxy butanol, diacetone alcohol, butanol or isopropanol; hydrocarbons, such as toluene, xylene or hexane; esters, such as ethyl acetate, butyl acetate, 2-methoxyethyl acetate, or 2-methoxypropyl acetate. These may be used singly or in combination.

For facilitating solubilization or dispersion, and improving bath stability as well as for producing a smooth coating film, the organic solvents may be added at the time of solubilizing and/or dispersing the cationic or anionic resin in water.

The color hues of the dyes and/or pigments mixed into the negative photosensitive coating may be suitably selected depending on desired applications, and may be similar to those employed for the above-mentioned positive photosensitive coating film.

The proportion of the dyes and/or pigments may be suitably selected depending on the objective, color hues, the type of the dyes and/or pigments employed or the dry film thickness of the negative photosensitive coating. It is preferably 3 to 70 wt % and preferably 5 to 60 wt % based on the total weight of the negative photosensitive coating.

Depending on the types or the proportions of the dyes and/or pigments, the coating film may not only be light-transmitting but also light-shielding, insofar as such is not detrimental to photocurability of the coating film. A black-hued light shielding coating film may be obtained by employing carbon black as pigments in, for example, an amount of 3 to 50 wt % based on the total weight of the negative photosensitive coating. The color hue of the dyes and/or the pigments includes white hue. It is desirable for the dyes and/or pigments to be purified and freed of impurities in order to produce a satisfactory coating. The photosensitive coating may also be admixed with various additives, such as dispersion assistant agents for the dyes or pigments, levelling agents for improving smoothness of the coating film, viscosity adjustment agents and anti-foaming agents.

The negative photosensitive coating may be prepared by mixing the negative photosensitive coating resin, photopolymerization initiators, organic solvents and/or water, dyes and/or pigments, if necessary, acidic or basic substances, dispersion assistant agents for the dyes and/or the pigments, or a variety of assistant agents, such as levelling agents for improving smoothness of the coating films, viscosity adjustment agents or anti-foaming agents, and sufficiently dispersing the resulting mixture using dispersion devices, such as sand mills, roll mills or attriters. There is no particular limitation to the film thickness of the negative photosensitive coating film formed by the negative photosensitive coating thus prepared, such that the film thickness can be suitably selected depending on the performance required of the color filter. Thus, the dry film thickness of the negative photosensitive coating film is usually 0.3 to 5 μm and preferably 1 to 3 μm. If the film is formed by electrodeposition, the film thickness can be controlled by adjusting electrodeposition conditions, such as current, voltage, electrodeposition time or liquid temperature. However, the electrodeposition may usually be carried out under conditions similar to those used for electrodeposition of the colored coating as explained in the step (c).

If the negative photosensitive coating film is not employed as a colored film, it is desirable not to add the colorant agent and to increase the film thickness to 5 to 15 μm for reducing the curing inhibiting action by oxygen or preventing pinholes.

With the method of the present invention, a third region where a light irradiation amount is different in at least three steps or stages is formed on the photosensitive coating film formed in the step (g) (referred to herein as a step (h)). There is no particular limitation to the shape of the third region which may be suitably determined depending on the objective of the color filter. Thus, in the third region colored layers may be formed. However, if the light shielding layer is formed during the steps (c) or (e), the operation of forming the light shielding layer during the step (h) is not essential.

There is no particular limitation to the method of forming the third region where the light irradiation amount is different in at least three steps. Thus, there may be mentioned a method in which the photosensitive coating film is exposed to light once through a mask having patterns of at least three different degrees of light transmittances, a method in which the photosensitive coating film is exposed to light through a mask having certain patterns of two different degrees of light transmittances, and the mask is at least once displaced to again expose the photosensitive coating film to light in a different light irradiation amount, and a method in which the photosensitive coating film is exposed to light through a mask having certain patterns of two different degrees of light transmittances, and the photosensitive coating film is then exposed to light through at least one other mask having patterns different from those of such certain patterns so as to change the light irradiation amount, with the above sequence of operations being repeated in case of necessity.

In the above case in which the photosensitive coating film is exposed to light once through a mask having patterns of at least three different degrees of light transmittances, the light transmittance means the intensity ratio of the exposure light before passing through the mask and that after passing through the mask. The mask has patterns of at least three different degrees of light transmittances, which may be determined depending on the number of types of the colored coatings employed. The difference of the light transmittances may be suitably selected depending on the light irradiation conditions and developing conditions as later explained.

In the above case in which the photosensitive coating film is exposed to light through a mask having certain specified patterns of two different degrees of light transmittances, and the mask is at least once displaced to again expose the photosensitive coating film to light in a different light irradiation amount, the displacement means changing the relative position between the mask and the substrate. For example, the mask may be displaced, with the substrate remaining stationary, or both the substrate and the mask may be moved. The mask having the above-mentioned specified patterns is preferably such a pattern through which light passes, referred to herein as pattern blocks, be not overlapped with one another after displacement a required number of times. Thus, the interval between one pattern block and another pattern block adjacent thereto needs to be large enough to prevent the pattern blocks from being overlapped during each light irradiation after the pattern block has been displaced the required number of times.

There is no particular limitation to the direction of mask displacement such that the mask may be displaced in a fore-and-aft directions or in the left-and-right direction, if within one and the same plane. The position and relative distance of the pattern blocks of the mask are determined depending on the number of times of displacement, the direction and distance of displacement.

Each time the mask is moved, the light irradiation is performed with the light irradiation amount different from that used during the previous light irradiation. There is no particular limitation to means for changing the light irradiation amounts such that any of the method of changing the light irradiation time, the method of changing the distance from the light source or the method of changing the output of the light source, may be employed. The difference between the light irradiation amounts may be suitably selected depending on the light irradiation conditions and the developing conditions as later explained. There is no particular limitation to the relative difference in the light irradiation amounts and a significant difference of not less than 5% is usually required.

If at least two masks having different patterns are alternately used for respective light irradiation operations, the light irradiation method or the light irradiation amount may be selected in the same manner as described above. With the above-described method of employing at least the two masks, the patterns of the respective masks may be partially overlapped with one another, in which case the light irradiation amounts via the masks may be different from one light irradiation to another. Alternatively, the light irradiation amounts may be the same for each mask by taking advantage of the fact that, even if the light irradiation amounts through the masks are the same, the light irradiation amount through the overlapped patterns becomes larger than that through the non-overlapped patterns.

With the method of the present invention, the photosensitive coating film of the third region is developed to lay-open the transparent electrically conductive layer and a colored coating is then electrodeposited thereon to form a colored layer. The operation of the developing and electrodepositing is sequentially repeated in the order of decreasing or increasing light irradiation amounts when the photosensitive coating film is a positive photosensitive coating film or a negative photosensitive coating film, respectively, to thereby form different colored layers (referred to herein as a step (i)). The smallest light irradiation amount portion may be a non-light irradiated portion.

In the case of forming a color filter in which an outer frame having the transparent electrically conductive layer laid-open is provided in the outer peripheral portion of the color filter, the photosensitive coating film of the third region is developed in the step (i) to lay-open a portion of the transparent electrically conductive layer, and the laid-open portion of the transparent electrically conductive layer is left intact without electrodepositing a colored layer.

If the positive photosensitive coating film has been formed in the step (g), the step (i) may be carried out in accordance with the step (c). If the negative photosensitive coating film has been formed in the step (g), the process other than the developing process may be carried out in accordance with the step (c). The developing conditions for the positive or negative photosensitive coating film may be varied depending on such factors as the light irradiation amounts which should be removed selectively, solubility of the positive or negative photosensitive coating in the developing solution, kinds or concentrations of the developing solutions, developing temperature or developing time. Thus, the developing conditions may be suitably selected which may be suited to the resins used for preparation of the photosensitive coating. For repeating the operations of selective removal by development and electrodeposition of the portions of different light irradiation amounts for the third region, it is desirable to lay in store a required number of developing solutions different in solubility in the positive or negative photosensitive coating. Alternatively, such selective development may be carried out by adjusting the developing time even if the number of types of the developing solutions is less than the required number of types.

The positive photosensitive coating film may be developed in the same manner as in the step (c) described above. The developing solution that may be used for developing the negative photosensitive coating film may be an aqueous solution of acidic substances if cationic resins are included as the component of the negative photosensitive coating. Such acidic substances may be enumerated by organic acids, such as formic acid, acetic acid, propionic acid or lactic acid and inorganic acids such as hydrochloric acid or phosphoric acid. If lactic acid, for example, is used as the developing solution, it is preferred that the lactic acid concentration, temperature and developing time be usually 0.01 to 50 wt % (preferably 0.01 to 30 wt %), 10° to 70° C. (preferably 20° to 50° C.) and 5 to 600 seconds, respectively. The developing solution that may be used for developing the negative photosensitive coating film may be an aqueous solution of basic substances if anionic resins are included as the component of the negative photosensitive coating. The basic substances may be enumerated by sodium carbonate, sodium hydrogen carbonate, sodium metasilicate, tetraalkyl ammonium hydroxide, sodium hydroxide and potassium hydroxide. If the aqueous solution of sodium carbonate, for example, is used as the developing solution, it is preferred that the sodium carbonate concentration, temperature and developing time be usually 0.01 to 25 wt % (preferably 0.05 to 15 wt %), 10° to 70° C. and 5 to 600 seconds (preferably 5 to 300 seconds), respectively. Organic solvents, such as alcohols, glycol ethers, ketones or chlorinated hydrocarbons may be employed as the developing solution. Surfactants or anti-foaming agents may also be added to the developing solution for improving wettability or defoaming. It is desirable to use aqueous developing solutions in view of toxicity and working environments.

The colored coating shown in the step (c) may be employed. The colored coating having the color hue not employed in the step (c) is usually employed. However, the colored coating may be of a color hue employed in the step (c) depending on the objective. Although the color hue of the colored coating usually differs from one light irradiation amount region to another, it is possible to use the color hue overlapped with that of the other regions depending on the objective.

In the fabrication of the color filter for a liquid crystal display device, it is desirable in the steps (c), (e) and (i) to produce colored coatings of at least red, blue and green color hues preferably with a light shielding layer being formed between the colored coatings and to provide a transparent outer frame on the outer periphery of the color filter. Registration marks may also be provided on the outer frame for convenience in the assembling operations of the color liquid crystal display device.

For fabricating the transparent outer frame in the present invention, a coating film of a transparent coating may be formed on the outer frame in one of the steps (c), (e) and (i). The transparent coating may be formed on the outer frame without the necessity of special precaution. That is, it suffices to form the coating film of the transparent coating by handling the outer frame as an ordinary colored layer.

In addition, an outer frame having the transparent electrically conductive layer may be formed in the step (i). That is, the outer frame having the transparent electrically conductive layer laid-open may be formed easily by having the outer frame not colored in the steps (a) to (e) with the outer frame being processed last in the steps (f) to (i) and by not carrying out the coloring operation after removal of the photosensitive coating film of the outer frame. The operation of coloring, washing with water and drying may be carried out substantially in accordance with the step (c).

The color filter as an ultimate product may be fabricated by the above steps (a) to (i). However, the steps of heating, curing or photocuring may be optionally performed for improving weatherability or resistance against chemicals. Such heating and curing may be carried out usually at a temperature of 100° to 270° C. for 5 minutes to one hour and preferably at a temperature of 120° to 250° C. for 15 to 40 minutes. According to the present invention, not only the colored layer and the light shielding layer but also the transparent and electrically conductive portion on the outer frame of the color filter may be fabricated without requiring special process steps.

The method for producing the color filter according to the present invention permits mass production in that fine processing technique is not necessitated and pattern shape of the colored layers may be selected with ample degree of freedom. In addition, it is possible with the present invention to fabricate the light shielding layer and the colored layers and, if needed, the transparent outer frame by a simplified method.

EXAMPLES OF THE INVENTION

The present invention will be specifically described with reference to Synthetic Examples and Examples, which are merely illustrative and are not intended for limiting the invention.

Synthetic Example 1

Synthesis of Black Coating (BK-1)

Synthesis of Colored Coating (R-1), (G-1) and (B-1)

An acrylic resin manufactured by TOAGOSEI CHEMICAL INDUSTRY CO., LTD. under the trade name of "ARON S-4020" was neutralized with triethylamine to a pH of approximately 8 and admixed with deionized water to give an aqueous resin solution S.

To the resin solution S were added carbon black, azo metal salt red pigment, Phthalocyanine Green and Phthalocyanine Blue under agitation to produce black, red, green and blue pigment dispersion liquids.

On the other hand, a mixture of the above acrylic resin and a melamine resin manufactured by SUMITOMO CHEMICALS CO., LTD. under the trade name of "M-56" was neutralized with triethylamine to a pH value of 8 and admixed with deionized water to give an aqueous resin solution T.

The resin solution T was admixed with each of the pigment dispersion liquids of the respective colors to give a black-hued coating (BK-1) and colored coatings (R-1, G-1 and B-1) having compositions shown in Table 1. The produced black-hued coating (BK-1) and the colored coatings (R-1, G-1 and B-1) were thermosetting and exhibited anionic electrodeposition properties.

TABLE 1

| Coating Number | BK-1 | R-1 | G-1 | B-1 |
| --- | --- | --- | --- | --- |
| Color | Black | Red | Green | Blue |
| Acrylic Resin (Remark 1) | 750.0 | 750.0 | 750.0 | 750.0 |
| Melamine Resin (Remark 2) | 250.0 | 250.0 | 250.0 | 250.0 |
| Triethylamine (Neutralizer) | 61.8 | 61.8 | 61.8 | 61.8 |
| Carbon Black | 333.0 | — | — | — |
| Phthalocyanine Blue | — | — | — | 300.0 |
| Phthalocyanine Green | — | — | 500.0 | — |
| Azometal Salt Red Pigment (Remark 3) | — | 500.0 | — | — |
| Deionized Water | 11935.2 | 13438.2 | 13438.2 | 11638.2 |

Remark 1: manufactured by TOAGOSEI CHEMICAL INDUSTRY CO., under the trade name of "ARON-4020"
Remark 2: manufactured by SUMITOMO CHEMICAL CO., LTD. under the trade name of "M-56"
Remark 3: manufactured by SANYO SHIKISO KK under the trade name of "PIGMENT RED 4BS"

Example 1

Figure 1:
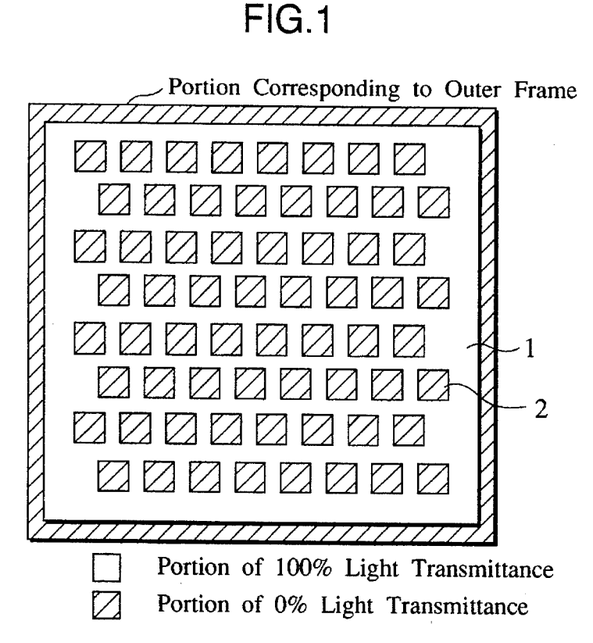
FIG. 1 is a schematic plan view showing a mask having light transmittances different in two steps.
Figure 2:
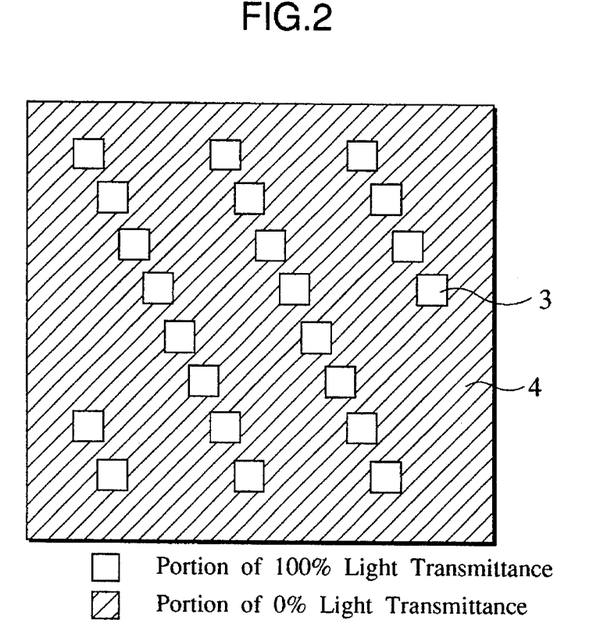
FIG. 2 is a schematic plan view showing another mask having light transmittances different in two steps.
Figure 3:
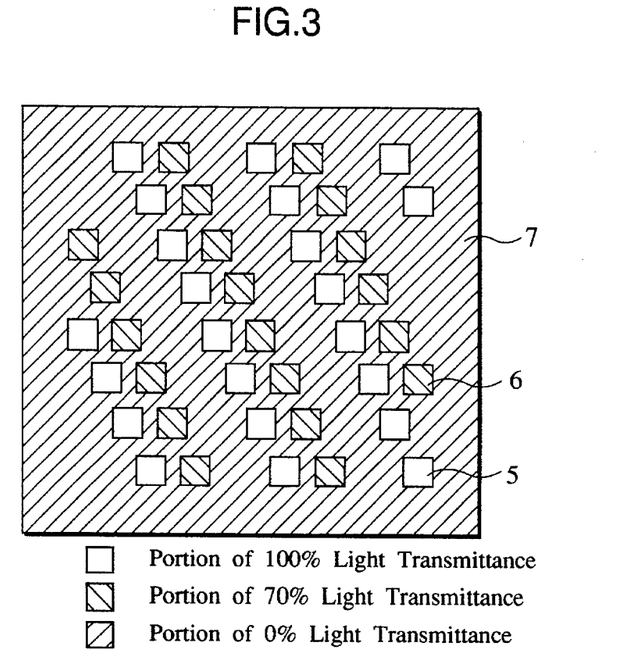
FIG. 3 is a schematic plan view showing a mask having light transmittances different in three steps.
Figure 4:
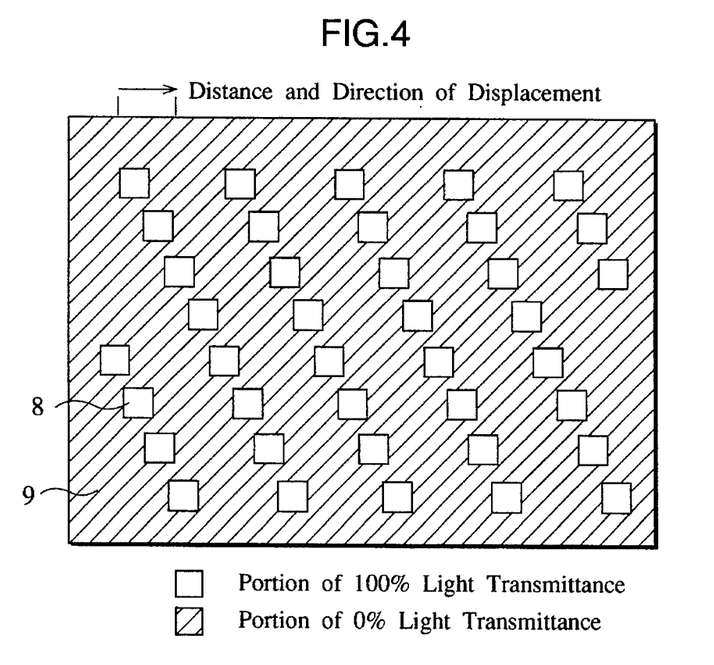
FIG. 4 is a schematic plan view showing a mask for displacement having light transmittances different in two steps.
Figure 5:
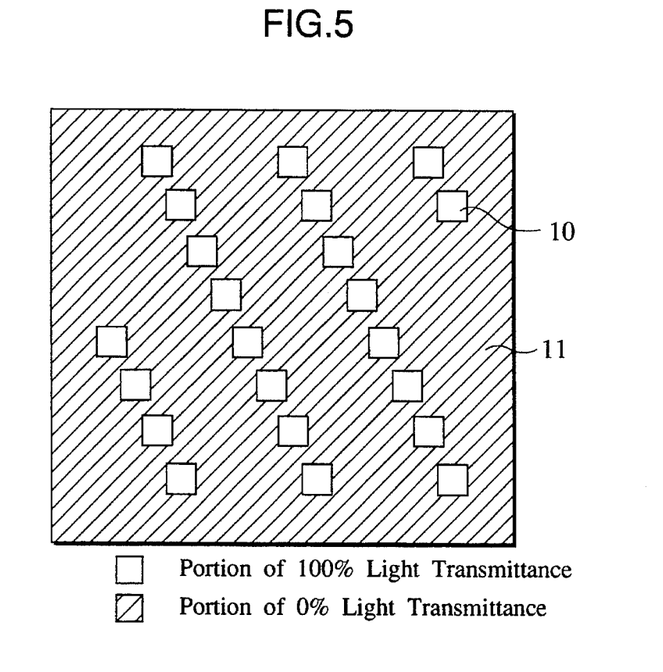
FIG. 5 is a schematic plan view showing still another mask having light transmittances different in two steps.
Figure 6:
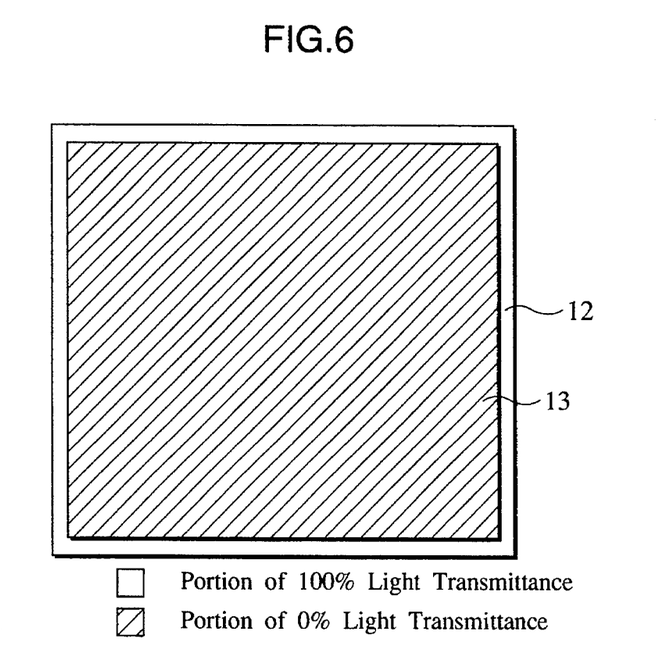
FIG. 6 is a schematic plan view showing a further mask having light transmittances different in two steps.
Figure 7:
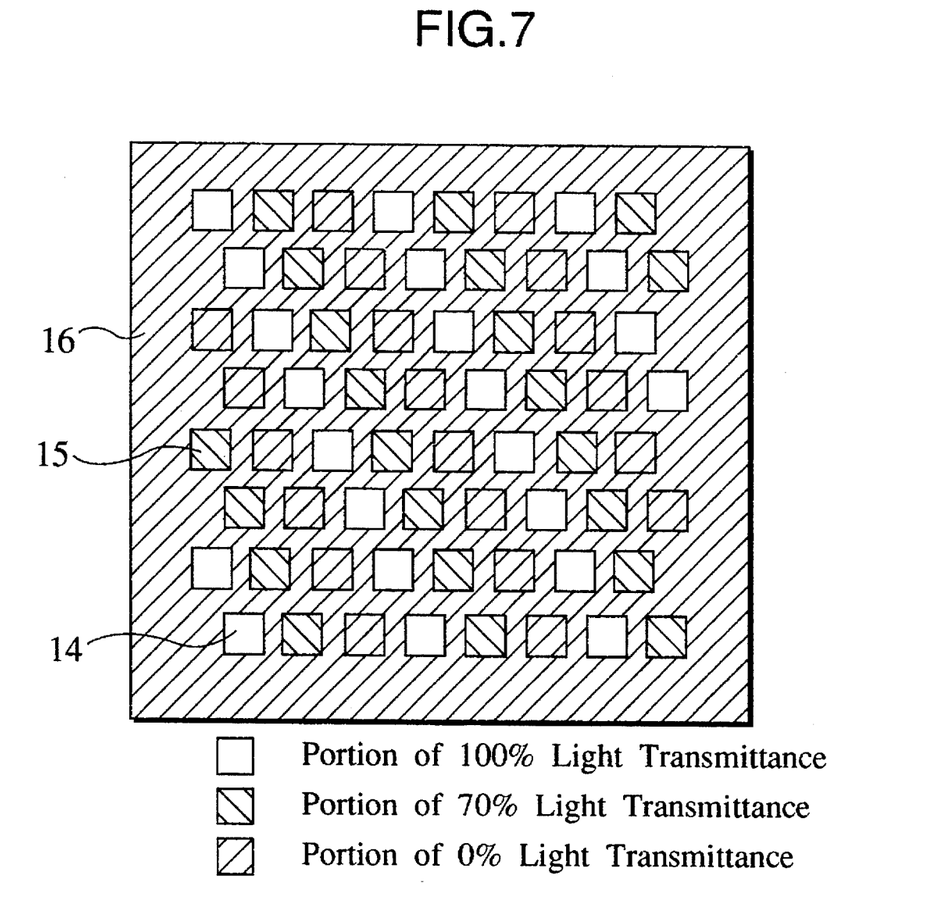
FIG. 7 is a schematic plan view showing a mask having light transmittances different in three steps.

In the Figures, the following numerals indicate the transmittance of the portion of the mask employed in the Examples:

FIG. 1, 1: 100% light transmittance; 2: 0% light transmittance;

FIG. 2, 3: 100% light transmittance; 4: 0% light transmittance;

FIG. 3, 5: 100% light transmittance; 6: 70% light transmittance; 7: 0% light transmittance;

FIG. 4, 8: 100% light transmittance; 9: 0% light transmittance;

FIG. 5, 10: 100% light transmittance; 11: 0% light transmittance;

FIG. 6, 12: 100% light transmittance; 13: 0% light transmittance;

FIG. 7, 14: 100% light transmittance; 15: 70% light transmittance; 16: 0% light transmittance.

On a pyrex glass substrate, 0.7 mm in thickness, having an ITO film, 100 nm in thickness on its surface, a positive photoresist manufactured by TOKYO OHKA KOGYO KK under the trade name of "OFPR-800" was applied by a spin coater and dried at 80° C. for ten minutes to form a positive photosensitive coating film having a film thickness of 2.5 μm. The resulting assembly is termed a master plate 1.

Using a UV light exposure device having a high-pressure mercury lamp, manufactured by ORC MANUFACTURING CO., LTD. under the trade name of "JL-3300", the master plate 1 was irradiated with a UV light at 100 mJ/cm$^2$ via a mask having a pattern with a portion 1 corresponding to a light shielding layer, as shown in FIG. 1. The master plate 1 was then developed with a 2.4 wt % aqueous solution of tetramethyl ammonium hydroxide. The portion of the positive photosensitive coating film corresponding to a light-irradiated region of the mask, that is the portion 1 of the mask having 100% light transmittance, was selectively removed to lay-open the transparent electrically conductive layer (ITO film). After washing with water and drying, electrodeposition was carried out at a dc voltage of 28 V at a temperature of 25° C. for 20 seconds, with the master plate 1 as an anode and a stainless steel beaker containing the black-hued coating (BK-1) as a cathode. After washing the master plate 1 with ion-exchanged water and drying at 120° C. for 10 minutes, a black-hued light shielding layer was formed.

Using a UV light exposure device having a high-pressure mercury lamp, manufactured by ORC MANUFACTURING CO., LTD. under the trade name of "JL-3300", the master plate 1 was irradiated with a UV light at 100 mJ/cm² via a mask having a pattern with a portion 3 corresponding to a first colored layer, as shown in FIG. 2. The master plate 1 was then developed with a 2.4 wt % aqueous solution of tetramethyl ammonium hydroxide. The portion of the positive photosensitive coating film corresponding to a light-irradiated region of the mask, that is the portion 3 of the mask having 100% light transmittance, was selectively removed to lay-open the transparent electrically conductive layer (ITO film). There was no change noticed in the black-hued light shielding layer. After washing with water and drying, a first red-hued coating (R-1) was electrodeposited in a similar manner to electrodeposition of the black-hued coating (BK-1). The resulting assembly was washed with ion-exchanged water and dried at 120° C. for ten minutes. The first colored layer was formed without any change in the previously formed black-hued light shielding layer.

The entire surface of the master plate 1 was irradiated with UV rays of 200 mJ/cm² and any remaining positive photosensitive coating film was removed with a 3.5 wt % aqueous solution of tetramethyl ammonium hydroxide. After washing with water and drying, a positive photoresist manufactured by TOKYO OHKA KOGYO KK under the trade name of "OFPR-800" was coated on the master plate 1 with a spin coater. After drying at 80° C. for ten minutes, a positive photosensitive coating film was formed to a film thickness of 2.5 μm.

Using a UV light exposure device having a high-pressure mercury lamp, manufactured by ORC MANUFACTURING CO., LTD. under the trade name of "JL-3300", the master plate 1 was irradiated with a UV light at 100 mJ/cm² via a mask shown in FIG. 3. The master plate 1 was then developed with a 2.4 wt % aqueous solution of tetramethyl ammonium hydroxide. The portion of-the positive photosensitive coating film corresponding to a maximum light-irradiated amount, that is a portion 5 of the mask having the maximum light transmittance, was selectively removed to lay-open the transparent electrically conductive layer (ITO film). After washing with water and drying, electrodeposition was carried out at a dc voltage of 28 V at a temperature of 25° C. for 20 seconds, with the master plate 1 as an anode and a stainless steel beaker containing the second colored (green) coating (G-1) as a cathode. After washing the master plate 1 with ion-exchanged water and drying at 120° C. for 10 minutes, the second colored (green) layer was formed.

The master plate 1 was then developed with a 3.5 wt % aqueous solution of tetramethyl ammonium hydroxide. The portion of the positive photosensitive coating film corresponding to a portion 6 of the mask having the second largest light irradiation amount, was selectively removed to lay-open the transparent electrically conductive layer (ITO film). After washing with water and drying, the third colored (blue) coating (B-1) was electrodeposited in a similar manner to electrodeposition of the colored coating (G-1) and the resulting assembly was washed with ion-exchanged water and dried at 120° C. for 10 minutes. The third colored layer was formed with no change noticed in the black-hued light shielding layer or in the firsthand second colored layers.

The entire surface of·the master plate 1 was irradiated with UV rays of 200 mJ/cm² and any remaining positive photosensitive coating film was removed with a 3.5 wt % aqueous solution of tetramethyl ammonium hydroxide. After washing with water and drying, the transparent electrically conductive layer of the outer frame of the color filter was laid-open. After heating at 180° C. for 30 minutes for curing the light shielding layer and the colored layers, a color filter having transparency with a uniform film thickness of 2 μm±0.1 μm which was not tacky at room temperature and which had the black-hued light shielding layer, the colored layers and the transparent outer frame was obtained.

Example 2

In Example 1, after the transparent electrically conductive layer of the outer frame of the color filter was laid-open, the transparent coating (the aqueous resin solution T) was electrodeposited in a similar manner to the colored coating. The resulting assembly was washed with ion-exchanged water and dried at 120° C. for ten minutes. The transparent outer frame was formed without any change noticed in the previously formed black-hued light shielding layer or in the first to third color layers. After heating at 180° C. for 30 minutes for curing the light shielding layer and the colored layers, a color filter having excellent transparency with a uniform film thickness of 2 μm±0.1 μm which was not tacky at room temperature and which had the black-hued light shielding layer, the colored layers and the transparent outer frame was obtained.

Example 3

On a pyrex glass substrate, 0.7 mm in thickness, having an ITO film 100 nm in thickens on its surface, a positive photoresist manufactured by TOKYO OHKA KOGYO KK under the trade name of "OFPR-800" was applied by a spin coater and dried at 80° C. for ten minutes to form a positive photosensitive coating film having a film thickness of 2.5 μm. The resulting assembly is termed a master plate 2.

Using a UV light exposure device having a high-pressure mercury lamp, manufactured by ORC MANUFACTURING CO., LTD under the trade name of "JL-3300" the master plate 2 was irradiated with a UV light at 100 mJ/cm² via a mask having a pattern with a portion 1 corresponding to a light shielding layer, as shown in FIG. 1. The master plate 2 was then developed with a 2.4 wt % aqueous solution of tetramethyl ammonium hydroxide. The portion of the positive photosensitive coating film corresponding to a light-irradiated region of the mask, that is the portion 1 of the mask having 100% light transmittance, was selectively removed to lay-open the transparent electrically conductive layer (ITO film). After washing with water and drying, electrodeposition was carried out at a dc voltage of 28 V at a temperature of 25° C. for 20 seconds, with the master plate 2 as an anode and a stainless steel beaker containing the black-hued coating (BK-1) as a cathode. After washing the master plate 2 with ion-exchanged water and drying at 120° C. for 10 minutes, a black-hued light shielding layer was formed.

Using a UV light exposure device having a high-pressure mercury lamp, manufactured by ORC MANUFACTURING CO., LTD under the trade name of "JL-3300", the master plate 2 was irradiated with a UV light at 100 mJ/cm² via a mask having a pattern with a portion 3 corresponding to a first colored layer, as shown in FIG. 2. The master plate 2 was then developed with a 2.4 wt % aqueous solution of tetramethyl ammonium hydroxide. The portion of the positive photosensitive coating film corresponding to a light-irradiated region of the mask, that is the portion 3 of the mask having 100% light transmittance, was selectively removed to lay-open the transparent electrically conductive layer (ITO film). There was no change noticed in the black-hued light shielding layer. After washing with water and drying, a first red-hued coating (R-1) was electrodeposited in a similar manner to electrodeposition of the black-hued coating (BK-1). The resulting assembly was washed with ion-exchanged water and dried at 120° C. for ten minutes. The first colored layer was formed without any change in the previously formed black-hued light shielding layer.

The entire surface of the master plate 2 was irradiated with UV rays of 200 mJ/cm$^2$ and any remaining positive photosensitive coating film was removed with a 3.5 wt % aqueous solution of tetramethyl ammonium hydroxide. After washing with water and drying, a positive photoresist manufactured by TOKYO OHKA KOGYO KK under the trade name of "OFPR-800" was coated on the master plate 2 with a spin coater. After drying at 80° C. for ten minutes, a positive photosensitive coating film was formed to a film thickness of 2.5 μm.

Using a UV light exposure device having a high-pressure mercury lamp, manufactured by ORC MANUFACTURING CO., LTD under the trade name of "JL-3300" the master plate 2 was irradiated with a UV light at 100 mJ/cm$^2$ via a mask having a sufficient length along the displacement direction, as shown in FIG. 4. This light irradiation is termed a "first light irradiation". The master plate 2 was then displaced a distance and in a direction indicated in FIG. 4 and irradiated with UV light at 75 mJ/cm$^2$ This light irradiation is termed a "second light irradiation".

The resulting assembly was developed with a 2.4 wt % aqueous solution of tetramethyl ammonium hydroxide. The portion of the positive photosensitive coating film having the maximum light irradiation amount, that was exposed by the first light irradiation, was selectively removed to lay-open the transparent electrically conductive layer (ITO film). After washing with water and drying, electrodeposition was carried out at a dc voltage of 28 V at a temperature of 25° C. for 20 seconds, with the master plate 2 as an anode and a stainless steel beaker containing the second colored (green) coating (G-1) as a cathode. After washing the master plate 2 with ion-exchanged water and drying at 120° C. for 10 minutes, the second colored (green) layer was formed. The master plate 2 was then developed with a 3.5 wt % aqueous solution of tetramethyl ammonium hydroxide. The portion of the positive photosensitive coating film corresponding to the portion of the mask having the second largest light-irradiation amount, that was exposed by the second light irradiation, was selectively removed to lay-open the transparent electrically conductive layer (ITO film). After washing with water and drying, the third colored (blue) coating (B-1) was electrodeposited in a similar manner to electrodeposition of the colored coating (G-I) and the resulting assembly was washed with ion-exchanged later and dried at 120° C. for 10 minutes. The -third colored layer was formed with no change noticed in the black-hued light shielding layer or in the first and second colored layers.

The entire surface of the master plate 2 was irradiated with UV rays of 200 mJ/cm$^2$ and any remaining positive photosensitive coating film was removed with a 3.5 wt % aqueous solution of tetramethyl ammonium hydroxide. After washing with water and drying, the transparent electrically conductive layer of the outer frame of the color filter was laid-open. After heating at 180° C. for 30 minutes for curing the light shielding layer and the colored layers, a color filter having transparency with a uniform film thickness of 2 μm±0.1 μm which was not tacky at room temperature and which had the black-hued light shielding layer, the colored layers and the transparent outer frame was obtained.

Example 4

On a pyrex glass substrate, 0.7 mm in thickness, having an ITO film 100 nm in thickness on its surface, a positive photoresist manufactured by TOKYO OHKA KOGYO KK under the trade name of "OFPR-800" was applied by a spin coater and dried at 80° C. for ten minutes to form a positive photosensitive coating film having a film thickness of 2.5 μm. The resulting assembly is termed a master plate 3. rising a UV light exposure device having a high-pressure mercury lamp, manufactured by ORC MANUFACTURING CO., LTD under the trade name of "JL-3300" the master plate 3 was with a UV light at 100 mJ/cm$^2$, via a mask having a irradiated pattern with a portion 1 corresponding to a light shielding layer, as shown in FIG. 1. The master plate 3 was then developed with a 2.4 wt % aqueous solution of tetramethyl ammonium hydroxide. The portion of the positive photosensitive coating film corresponding to a light-irradiated region of the mask, that is the portion 1 of the mask having 100% light transmittance, was selectively removed to expose the transparent electrically conductive layer (ITO film). After washing with water and drying, electrodeposition was carried out at a dc voltage of 28 V at a temperature of 25° C. for 20 seconds, with the master plate 3 as an anode and a stainless steel beaker containing the black-hued coating (BK-1) as a cathode. After washing the master plate 3 with ion-exchanged water and drying at 120° C. for 10 minutes, a black-hued light shielding layer was formed.

Using a UV light exposure device having a high-pressure mercury lamp, manufactured by ORC MANUFACTURING CO., LTD under the trade name of "JL-3300" the master plate 3 was irradiated with a UV light at 100 mJ/cm$^2$ via a mask having a pattern with a portion 3 corresponding to a first colored layer, as shown in FIG. 2. The master plate 3 was then developed with a 2.4 wt % aqueous solution of tetramethyl ammonium hydroxide. The portion of the positive photosensitive coating film corresponding to a light-irradiated region of the mask, that is the portion 3 of the mask having 100% light transmittance, was selectively removed to lay-open the transparent electrically conductive layer (ITO film). There was no change noticed in the black-hued light shielding layer. After washing with water and drying, a first red-hued coating (R-1) was electrodeposited in a similar manner to electrodeposition of the black-hued coating (BK-1). The resulting assembly was washed with ion-exchanged water and dried at 120° C. for ten minutes. The first colored layer was formed without any change in the previously formed black-hued light shielding layer.

The entire surface of the master plate 3 was irradiated with UV rays of 200 mJ/cm$^2$ and any remaining positive photosensitive coating film was removed with a 3.5 wt % aqueous solution of tetramethyl ammonium hydroxide. After washing with water and drying, a positive photoresist manufactured by TOKYO OHKA KOGYO KK under the trade name of "OP-2 RESIST DA" was coated on the master plate 3 with a spin coater. After drying at 80° C. for ten minutes, a negative photosensitive coating film was formed to a film thickness of 5.0 μm.

Using a UV light exposure device having a high-pressure mercury lamp, manufactured by ORC MANUFACTURING CO., LTD under the trade name of "JL-3300" the master plate 3 was irradiated with a UV light at 20 mJ/cm$^2$ via a mask shown in FIG. 5. This light irradiation is termed a "first light irradiation". The master plate 3 was then irradiated with UV light at 100 mJ/cm$^2$ via a mask shown in FIG. 6. This light irradiation is termed a "second light irradiation".

The master plate 3 was developed with a 0.5 wt % aqueous solution of sodium carbonate. The portion of the negative photosensitive coating film having the minimum light irradiation amount, that is the film portion not irradiated with light by the first light irradiation and the second light irradiation, was selectively removed, and the transparent electrically conductive layer (ITO layer) of the removed portion devoid of the light shielding portion was laid-open. After washing with water and drying, electrodeposition was carried out for 20 seconds at a dc voltage of 28 V at a temperature of 25° C., with the master plate 3 as an anode and with the stainless steel beaker containing the second colored (green) coating (G-1) as a cathode. After washing the master plate 3 with ion-exchanged water, the master plate 3 was dried at 120° C. for ten minutes to form a second colored layer.

The master plate 3 was developed with a 0.5 wt % aqueous solution of sodium metasilicate. A portion 10 of the negative photosensitive coating film having the second smallest light irradiated amount, that is the portion irradiated with the first light irradiation, was selectively removed to expose the transparent electrically conductive layer (ITO film). There was no change noticed in the black-hued light shielding layer. After washing with water and drying, the third blue colored coating (B-1) was electrodeposited in a similar manner to the electrodeposition of the black-hued coating (BK-1). The resulting master plate 3 was washed with ion-exchanged water and dried at 120° C. for ten minutes. A third colored layer was formed without any change noticed in the previously formed light shielding layer or in the first and second colored layers.

The remaining portion of the negative photosensitive coating film, that is a portion 12 of the negative photosensitive coating film irradiated with light by the second light irradiation, was removed with a 1.0% aqueous solution of NaOH to lay-open the transparent electrically conductive layer of the outer frame portion. After washing with water and drying, the master plate 3 was heated at 180° C. for 30 minutes for curing the light shielding layer and the colored layers. A color filter excellent in uniformity and transparency and having the black-hued light shielding layer and colored layers, with a film thickness of 2 μm±0.1 μm, not tacky at room temperature, and also having a transparent outer frame with the exposed transparent electrically conductive layer, could be obtained.

Example 5

On a pyrex glass substrate, 0.7 mm in thickness, having an ITO film 100 nm in thickness on its surface, a positive photoresist manufactured by TOKYO OHKA KOGYO KK under the trade name of "OFPR-800" was applied by a spin coater and dried at 80° C. for ten minutes to form a positive photosensitive coating film having a film thickness of 2.5 μm. The resulting assembly is termed a master plate 4.

Using a UV light exposure device having a high-pressure mercury lamp, manufactured by ORC MANUFACTURING CO., LTD. under the trade name of "JL-3300", the master plate 4 was irradiated with a UV light at 100 mJ/cm² via a mask having a pattern with a portion 1 corresponding to a light shielding layer, as shown in FIG. 1. The master plate 4 was then developed with a 2.4 wt % aqueous solution of tetramethyl ammonium hydroxide. The portion of the positive photosensitive coating film corresponding to a light-irradiated region of the mask, that is the portion 1 of the mask having 100% light transmittance, was selectively removed to expose the transparent electrically conductive layer (ITO film). After washing with water and drying, electrodeposition was carried out at a dc voltage of 28 V at a temperature of 25° C. for 20 seconds, with the master plate 4 as an anode and with a stainless steel beaker containing the black-hued coating (BK-1) as a cathode. After washing the master plate 4 with ion-exchanged water and drying at 120° C. for 10 minutes, a black-hued light shielding layer was formed.

Using a UV light exposure device having a high-pressure mercury lamp, manufactured by ORC MANUFACTURING CO., LTD under the trade name of "JL-3300" the master plate 4 was irradiated with a UV light at 100 mJ/cm², via a mask shown in FIG. 6. The master plate 4 was then developed with a 2.4 wt % aqueous solution of tetramethyl ammonium hydroxide. The portion of the positive photosensitive coating film corresponding to a light-irradiated region of the mask, that is a portion 12 of the mask having 100% light transmittance, was selectively removed to lay-open the transparent electrically conductive layer (ITO film). After washing with water an drying, electrodeposition was carried out for 20 seconds at a dc voltage of 28 V at a temperature of 25° C., with the master plate 4 as an anode and with a stainless steel beaker containing a transparent coating (the aqueous resin solution T) as a cathode. After washing the master plate 4 with ion-exchanged water and drying at 120° C. for ten minutes, a transparent outer frame was formed.

The entire surface of the master plate 4 was irradiated with UV rays of 200 mJ/cm² and any remaining positive photosensitive coating film was removed with a 3.5 wt % aqueous solution of tetramethyl ammonium hydroxide. After washing with water and drying, a positive photoresist manufactured by TOKYO OHKA KOGYO KK under the trade name of "OFPR-800" was coated on the master plate 4 with a spin coater. After drying at 80° C. for ten minutes, a positive photosensitive coating film was formed to a film thickness of 2.5 μm.

Using a UV light exposure device having a high-pressure mercury lamp, manufactured by ORC MANUFACTURING CO., LTD under the trade name of "JL-3300" the master plate 4 was irradiated with a UV light at 100 mJ/cm² via a mask shown in FIG. 7. The master plate 4 was then developed with a 2.4 wt % aqueous solution of tetramethyl ammonium hydroxide. The portion of the positive photosensitive coating film corresponding to a maximum light-irradiated amount, that is a portion 14 of the mask having the maximum light transmittance, was selectively removed to lay-open the transparent electrically conductive layer (ITO film). After washing with water and drying, the first (red) colored coating (R-1) was electrodeposited in a similar manner to electrodeposition of the black-hued coating (BK-1) and washed with ion-exchanged water and dried at 120° C. for 10 minutes. The first colored layer was formed without any change noticed in the previously formed black-hued light shielding layer or the outer frame.

The master plate 4 was then developed with a 3.5 wt % aqueous solution of tetramethyl ammonium hydroxide. The portion of the positive photosensitive coating film with the second largest light irradiation amount corresponding to a portion 15 of the mask having the second largest light irradiation amount, was selectively removed to lay-open the transparent electrically conductive layer (ITO film). After washing with water and drying, electrodeposition was performed for 20 seconds at 25° C. at a dc 28 V with a stainless steel beaker containing a colored coating (G-1) of the second color hue (green) as a cathode. After washing the master plate 4 with ion-exchanged water, the master plate 4 was dried at 120° C. for ten seconds to form a colored layer of the second color (green).

The entire surface of the master plate 4 was irradiated with UV rays of 200 mJ/cm$^2$ and any remaining positive photosensitive coating film was removed with a 3.5 wt % aqueous solution of tetramethyl ammonium hydroxide. After washing with water and drying, the portion of the transparent electrically conductive layer other than the black-hued light shielding layer, the outer frame and the first and second colored layers, that is the portion thereof corresponding to the third colored layer, was laid-open. After washing with water and drying, the third colored coating (B-1) was electrodeposited in a similar manner to the electrodeposition of the colored coating (R-1). The master plate 4 thus processed was washed with ion-exchanged water and dried at 120° C. for ten minutes. There was formed a third colored layer without any change noticed in the previously formed black-hued light shielding layer, the outer frame or in the first and second colored layers. The master plate 4 was heated at 180° C. for 30 minutes for curing the light shielding layer, the outer frame and the colored layers. A color filter excellent in uniformity and transparency and having the black-hued light shielding layer and colored layers, with a film thickness of 2 μm±0.1 μm, not tacky at room temperature, and also having a transparent outer frame could be obtained.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A method for producing a color filter comprising the steps of:
   (a) forming a positive photosensitive coating film on a transparent electrically conductive layer of a transparent substrate having said transparent electrically conductive layer thereon;
   (b) forming on said positive photosensitive coating film a first region where a light irradiation amount is different in two steps;
   (c) developing at least a light-irradiated portion of the first region of the positive photosensitive coating film to lay-open said transparent electrically conductive layer followed by electrodepositing a black-hued coating thereon to form a light shielding layer;
   (d) forming on the positive photosensitive coating film not developed in said step (c) a second region where a light irradiation amount is different in two steps;
   (e) developing at least a light-irradiated portion of the second region of the positive photosensitive coating film to lay-open the transparent electrically conductive layer followed by electrodepositing a colored coating thereon to form a colored layer;
   (f) removing the positive photosensitive coating film not developed in said steps (c) and (e);
   (g) forming a photosensitive coating film on said transparent substrate from which said positive photosensitive coating film is removed in said step (f), said photosensitive coating film being selected from the group consisting of a positive photosensitive coating film and a negative photosensitive coating film;
   (h) forming on said photosensitive coating film formed in said step (g) a third region where a light irradiation amount is different in at least three steps; and
   (i) developing the photosensitive coating film of the third region to lay-open the transparent electrically conductive layer followed by electrodepositing a colored coating thereon to form a colored layer, operation of said developing and electrodepositing being sequentially repeated in an order of decreasing light irradiation amounts when said photosensitive coating film is a positive photosensitive coating film, and in an order of increasing light irradiation amounts when said photosensitive coating film is a negative photosensitive coating film, to thereby form different colored layers.

2. A method for producing a color filter comprising the steps of:
   (a) forming a positive photosensitive coating film on a transparent electrically conductive layer of a transparent substrate having said transparent electrically conductive layer thereon;
   (b) forming on said positive photosensitive coating film a first region where a light-irradiation amount is different in two steps;
   (c) developing at least a light-irradiated portion of the first region of the positive photosensitive coating film to lay-open said transparent electrically conductive layer followed by electrodepositing a black-hued coating thereon to form a light shielding layer;
   (d) forming on the positive photosensitive coating film not developed in said step (c) a second region where a light irradiation amount is different in two steps;
   (e) developing at least a light-irradiated portion the second region of the positive photosensitive coating film to lay-open the transparent electrically conductive layer followed by electrodepositing a colored coating thereon to form a colored layer;
   (f) removing the positive photosensitive coating film not developed in said steps (c) and (e);
   (g) forming a photosensitive coating film on said transparent substrate from which said positive photosensitive coating film is removed in said step (f), said photosensitive coating film being selected from the group consisting of a positive photosensitive coating film and a negative photosensitive coating film;
   (h) forming on said photosensitive coating film formed in said step (g) a third region where a light irradiation amount is different in at least three steps; and
   (i) developing the photosensitive coating film of the third region to lay-open the transparent electrically conductive layer followed by electrodepositing a colored coating thereon to form a colored layer while a portion of the transparent electrically conductive layer thus laid-open is left intact, operation of said developing and electrodepositing being sequentially repeated in an order of decreasing light irradiation amounts when said photosensitive coating film is a positive photosensitive coating film, and in an order of increasing light irradiation amounts when said photosensitive coating film is a negative photosensitive coating film, to thereby form different colored layers.

3. A method for producing a color filter comprising the steps of:
   (a) forming a positive photosensitive coating film on a transparent electrically conductive layer of a transparent substrate having said transparent electrically conductive layer thereon;

(b) forming on said positive photosensitive coating film a first region where a light irradiation amount is different in two steps;

(c) developing at least a light-irradiated portion of the first region of the positive photosensitive coating film to lay-open said transparent electrically conductive layer followed by electrodepositing a black-hued coating thereon to form a light shielding layer;

(d) forming on the positive photosensitive coating film not developed in said step (c) a second region where a light irradiation amount is different in two steps;

(e) developing at least a light-irradiated portion of the second region of the positive photosensitive coating film to lay-open the transparent electrically conductive layer followed by electrodepositing a transparent coating thereon to form a transparent layer in an outer frame of said color filter;

(f) removing the positive photosensitive coating film not developed in said steps (c) and (e);

(g) forming a photosensitive coating film on said transparent substrate from which said positive photosensitive coating film is removed in said step (f), said photosensitive coating film being selected from the group consisting of a positive photosensitive coating film and a negative photosensitive coating film;

(h) forming on said photosensitive coating film formed in said step (g) a third region where a light irradiation amount is different in at least three steps; and (i) developing the photosensitive coating film of the third region to lay-open the transparent electrically conductive layer followed by electrodepositing a colored coating thereon to form a colored layer, operation of said developing and electrodepositing being sequentially repeated in an order of decreasing light irradiation amounts when said photosensitive coating film is a positive photosensitive coating film, and in an order of increasing light irradiation amounts when said photosensitive coating film is a negative photosensitive coating film, to thereby form different colored layers.

4. A method for producing a color filter comprising the steps of:

(a) forming a positive photosensitive coating film on a transparent electrically conductive layer of a transparent substrate having said transparent electrically conductive layer thereon;

(b) forming on said positive photosensitive coating film a first region where a light-irradiation amount is different in two steps;

(c) developing at least a light-irradiated portion of the first region of the positive photosensitive coating film to lay-open said transparent electrically conductive layer followed by electrodepositing a black-hued coating thereon to form a light shielding layer;

(d) forming on the positive photosensitive coating film not developed in said step (c) a second region where a light irradiation amount is different in two steps;

(e) developing at least a light-irradiated portion the second region of the positive photosensitive coating film to lay-open the transparent electrically conductive layer followed by electrodepositing a colored coating thereon to form a colored layer;

(f) removing the positive photosensitive coating film not developed in said steps (c) and (e);

(g) forming a photosensitive coating film on said transparent substrate from which said positive photosensitive coating film is removed in said step (f), said photosensitive coating film being selected from the group consisting of a positive photosensitive coating film and a negative photosensitive coating film;

(h) forming on said photosensitive coating film formed in said step (g) a third region where a light irradiation amount is different in at least three steps; and (i) developing the photosensitive coating film of the third region to lay-open the transparent electrically conductive layer followed by electrodepositing a colored coating thereon to form a colored layer and electrodepositing a transparent coating to form a transparent layer in an outer frame of said color filter, operation of said developing and electrodepositing colored layers being sequentially repeated in an order of decreasing light irradiation amounts when said photosensitive coating film is a positive photosensitive coating film, and in an order of increasing light irradiation amounts when said photosensitive coating film is a negative photosensitive coating film; to thereby form different colored layers.

5. The method according to claim 1, 2, 3 or 4 wherein said first region where the light irradiation amount is different in two steps in said step (b) comprises a light irradiated portion and a non-light irradiated portion.

6. The method according to claim 1, 2, 3, or 4 wherein in said step (f) the positive photosensitive coating film not developed in said steps (c) and (e) is removed using a developing solution having high dissolution capability.

7. The method according to claim 1, 2, 3, or 4 wherein in said step (f) the positive photosensitive coating film not developed in said steps (c) and (e) is removed by light exposure followed by development with a developing solution.

8. The method according to claim 1, 2, 3 or 4 wherein said step (h) said photosensitive coating film is exposed to light once through a mask having patterns of at least three different degrees of light transmittances.

9. The method according to claim 1, 2, 3 or 4 wherein in said step (h) said photosensitive coating film is exposed to light through a mask having certain patterns of two different degrees of light transmittances, and said mask is at least once displaced to again expose the photosensitive coating film to light in a different light irradiation amount.

10. The method according to claim 1, 2, 3 or 4 wherein in said step (h) said photosensitive coating film is exposed to light through a mask having certain patterns of two different degrees of light transmittances, and the photosensitive coating film is then exposed to light through at least one other mask having patterns different from those of said certain patterns so as to change light irradiation amount.

* * * * *